(12) United States Patent
Itou et al.

(10) Patent No.: US 9,263,878 B2
(45) Date of Patent: Feb. 16, 2016

(54) CIRCUIT PROTECTOR

(71) Applicant: DENSO CORPORATION, Kariya, Aichi-pref. (JP)

(72) Inventors: Masaya Itou, Toyota (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 40 days.

(21) Appl. No.: 13/886,918

(22) Filed: May 3, 2013

(65) Prior Publication Data

US 2013/0342939 A1    Dec. 26, 2013

(30) Foreign Application Priority Data

Jun. 26, 2012 (JP) ................. 2012-142804

(51) Int. Cl.
*H02H 3/20* (2006.01)
*H01M 10/48* (2006.01)
*B60L 3/00* (2006.01)
*B60L 11/18* (2006.01)
*G01R 31/36* (2006.01)

(52) U.S. Cl.
CPC ............. *H02H 3/202* (2013.01); *B60L 3/0046* (2013.01); *B60L 11/1851* (2013.01); *H01M 10/48* (2013.01); *G01R 31/3658* (2013.01); *H01M 2220/20* (2013.01); *Y02T 10/705* (2013.01); *Y02T 10/7005* (2013.01)

(58) Field of Classification Search
CPC .. H02H 3/202; H01M 10/48; H01M 2220/20; B60L 11/1851; B60L 3/0046; Y02T 10/705; Y02T 10/7005; G01R 31/3658
USPC .......................................................... 361/55
See application file for complete search history.

(56) References Cited

U.S. PATENT DOCUMENTS

| 6,611,774 | B1 * | 8/2003 | Zaccaria | ........................ 702/63 |
| 2005/0248899 | A1 * | 11/2005 | Huang | ........................ 361/118 |
| 2008/0157718 | A1 | 7/2008 | Ohnuki | |

(Continued)

FOREIGN PATENT DOCUMENTS

| JP | 2000-201429 | 7/2000 |
| JP | 2005-143160 | 6/2005 |

(Continued)

OTHER PUBLICATIONS

Office Action (3 pages) dated Apr. 15, 2014, issued in corresponding Japanese Application No. 2012-142804 and English translation (5 pages).

*Primary Examiner* — Scott Bauer
(74) *Attorney, Agent, or Firm* — Nixon & Vanderhye P.C.

(57) ABSTRACT

A circuit protector includes a plurality of detection lines that connect between a battery pack and a monitoring circuit, an overvoltage protection element connected between the detection lines that keeps the voltage applied to the monitoring circuit at a fixed voltage, and a circuit protection element disposed in each detection line that disconnects an electrical link between the monitoring circuit and the battery pack when a current beyond a predetermined current value flows into the detection line. When the excess voltage occurs in the battery pack, the overvoltage protection element maintains between each detection line in a short circuit state, and the circuit protection element disconnects the electrical link between the battery pack and the monitoring circuit by a short-circuit current that flows between the detection lines via the overvoltage protection element.

6 Claims, 3 Drawing Sheets

(56) References Cited

U.S. PATENT DOCUMENTS

2011/0149454 A1 6/2011 Shibuya et al.
2012/0127619 A1* 5/2012 Mikolajczak .................. 361/79

FOREIGN PATENT DOCUMENTS

| | | |
|---|---|---|
| JP | 2009-219215 | 9/2009 |
| JP | 4537993 | 6/2010 |

* cited by examiner

CIRCUIT PROTECTOR

CROSS-REFERENCE TO RELATED APPLICATION

The application is based on and claims the benefit of priority from earlier Japanese Patent Application No. 2012-142804 filed Jun. 26, 2012, the description of which is incorporated herein by reference.

TECHNICAL FIELD

The present disclosure relates to a circuit protector for protecting a monitoring circuit that monitors a voltage of a power supply unit.

BACKGROUND

Conventionally, a hybrid vehicle or an electric vehicle, for example, is equipped with a battery pack, which has many battery cells connected in series, as a power supply unit, and an electric motor for driving the vehicle is driven by a voltage generated in the power supply unit.

Such a kind of power supply unit is connected to a monitoring circuit that monitors a voltage in order to prevent generation of heat, damage by fire, degradation, etc. accompanied with a voltage abnormality (refer to Japanese Patent No. 4537993, for example).

Here, between the power supply unit and the monitoring circuit is electrically connected by a plurality of detection lines for voltage detection, and there is a possibility that the monitoring circuit may be damaged when excess voltage occurs in the power supply unit or high current flows into the detection lines under influences of peripheral devices, etc.

Hence, it is necessary to provide a circuit protector that protects the monitoring circuit between the power supply unit and the monitoring circuit.

For the circuit protector, a composition that prepares circuit protection elements, such as a fuse, on each detection line, for example, may be mentioned.

Accordingly, suppression of the over-current to the monitoring circuit becomes possible because the circuit protection element of the detection line is disconnected when a large current more than a rated current flows into the detection line.

Moreover, a Zener diode (overvoltage protection element) may be connected between each detection line as a circuit protector so as to be together with the power supply unit.

Accordingly, when an excess voltage occurs in the power supply unit, a voltage applied to the monitoring circuit can be maintained at a fixed voltage because a short-circuit current flows between each detection line through the Zener diode.

By the way, the current that flows into each detection line when the excess voltage occurs in the power supply unit varies according to an internal composition (impedance) of the monitoring circuit.

Therefore, when the circuit protector is constituted from circuit protection elements such as fuses, it is difficult to set up the rated current of the circuit protection element in order that the detection line is intercepted when the excess voltage is occurring, thus the monitoring circuit cannot be protected appropriately.

On the other hand, when the circuit protector is constituted from overvoltage protection elements such as Zener diodes, the overvoltage protection element may be damaged by the large current (short-circuit current) that flows between each detection line when the excess voltage occurs in the power supply unit.

If the failure of the overvoltage protection element at this occasion is an open-circuit fault where an internal current path has been disconnected, there is a possibility that the monitoring circuit may be damaged because the excess voltage that occurred in the power supply unit is applied to the monitoring circuit.

Thus, the monitoring circuit cannot be appropriately protected from the excess voltage that occurred in the power supply unit with the conventional circuit protector, therefore, it is necessary to constitute each element in the monitoring circuit from a high voltage element with high electrical robustness, or to add protection elements in the monitoring circuit, and a complicated circuit configuration in the power supply system or cost escalation cannot be avoided.

SUMMARY

An embodiment provides a circuit protector that can protect a monitoring circuit appropriately from an excess voltage that occurred in a power supply unit.

The present disclosure is aimed at a circuit protector that protects a monitoring circuit that monitors a voltage of a power supply unit.

In a circuit protector according to a first aspect, the circuit protector for protecting a monitoring circuit that monitors a voltage of a power supply unit includes a plurality of detection lines for voltage detection that connect between the power supply unit and the monitoring circuit, an overvoltage protection element connected between the detection lines that keeps the voltage applied to the monitoring circuit at a fixed voltage, and a circuit protection element disposed in each detection line that disconnects an electrical link between the monitoring circuit and the power supply unit when a current beyond a predetermined current value flows into the detection line.

The overvoltage protection element is constituted so that conduction between each detection line is maintained in a short circuit state, i.e. they are all kept connected together, when an excess voltage occurs in the power supply unit.

The circuit protection element is constituted so that the electrical link between the power supply unit and the monitoring circuit is intercepted by a short-circuit current that flows between the detection lines via the overvoltage protection element when the excess voltage occurs in the power supply unit.

Thereby, between the plurality of detection lines is maintained in the short circuit state by the overvoltage protection element when the excess voltage occurs in the power supply unit, and since the electrical link between the power supply unit and the monitoring circuit is intercepted by the circuit protection element, the monitoring circuit can be appropriately protected from the excess voltage occurring in the power supply unit.

As a result, it is not necessary to constitute the monitoring circuit from a high voltage element with high electrical robustness, or to add a protection element in the monitoring circuit in order to prevent failure of the monitoring circuit due to the excess voltage that occurs in the power supply unit, and this can suppress a complication of the circuit configuration accompanying a suitable protection of the monitoring circuit and cost escalation.

In addition, since the circuit protection element can configure the breaking current (rated current) on the basis of the short-circuit current that flows between each detection line when the excess voltage occurs in the power supply unit, it becomes easy to select the circuit protection element.

In the circuit protector according to a second aspect, the overvoltage protection element is constituted by a Zener diode that short-circuit-faults when the excess voltage is applied thereto.

In the circuit protector according to a third aspect, the circuit protection element is constituted by a fuse that breaks due to the short-circuit current that flows between the detection lines via the overvoltage protection element when the excess voltage occurs in the power supply unit.

In the circuit protector according to a fourth aspect, the circuit protection element is constituted by a low resistance resistor that is blown due to the short-circuit current that flows between the detection lines via the overvoltage protection element when the excess voltage occurs in the power supply unit.

DETAILED DESCRIPTION OF THE PREFERRED EMBODIMENTS

With reference to the accompanying drawings, hereinafter will be described an embodiment of the present disclosure.

First Embodiment

A circuit protector of the present disclosure is applied to an electric power system installed in a hybrid vehicle or an electric vehicle in the present embodiment.

Figure 1:
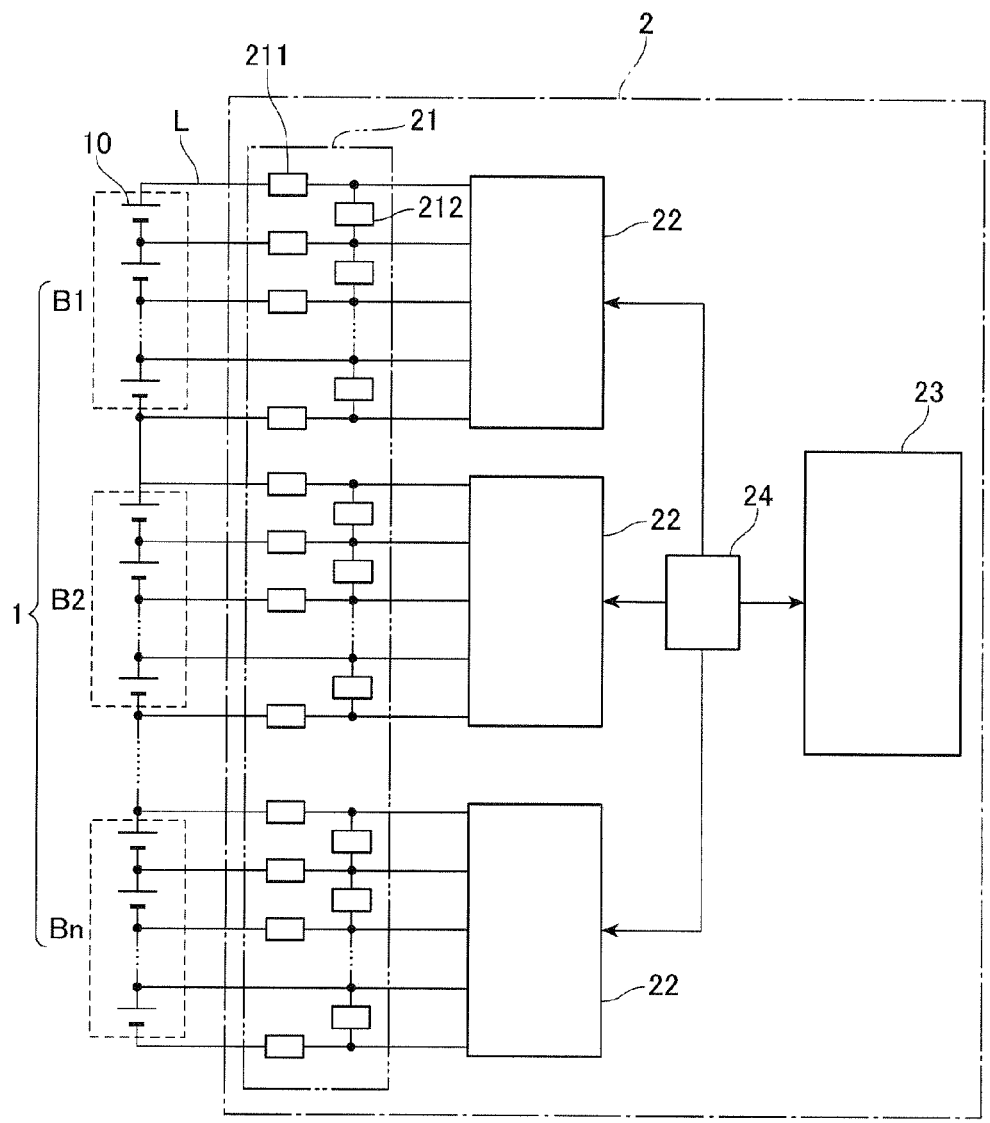
FIG. 1 shows a block diagram of an entire electric power system in a first embodiment.

As shown in FIG. 1, an electric power system of the present embodiment is has a battery pack 1 and a battery monitor 2 as main components.

The battery pack 1 supplies electric power to various in-vehicle current consumers, mainly to an electric motor for driving the vehicle, and constitutes a power supply unit of the present disclosure.

The battery pack 1 of the present embodiment is constituted by connecting a plurality of battery cells 10 made of rechargeable batteries, such as a lithium ion battery, in series, and is constituted as a series-connected body of a plurality of battery blocks B1 . . . Bn grouped every predetermined number of battery cells 10 that are adjoining each other.

The battery monitor 2 is a device that monitors the battery pack 1 by detecting various states, such as voltage of the battery pack 1, and is connected to both terminals of each battery cell 10 of the battery pack 1 through detection lines L, etc., for voltage detection.

The battery monitor 2 of the present embodiment is equipped has a circuit protecting section 21, a plurality of monitoring circuits 22, a control section 23, and an insulated section 24 as main components.

The circuit protecting section 21 is a circuit protector that protects the monitoring circuits 22 from the battery pack 1, and has circuit protection element 211s and overvoltage protection elements 212.

The circuit protection element 211 is an element that is disposed in each detection line L and intercepts an electrical link between the monitoring circuits 22 and the battery pack 1 when a current beyond a predetermined current value flows into the detection line L.

Moreover, the overvoltage protection element 212 is an element that is connected between each detection line L and keeps the voltage applied to the monitoring circuit 22 at a fixed voltage.

Details of the circuit protection element 211 and the overvoltage protection element 212 in the circuit protecting section 21 are mentioned later.

A plurality of the monitoring circuits 22 are provided corresponding to respective battery blocks B1 . . . Bn of the battery pack 1, and are circuits that monitor a block voltage of battery blocks B1 . . . Bn and a cell voltage of the battery cell 10 in the battery pack 1.

The monitoring circuit 22 of the present embodiment is constituted so that a signal that shows a voltage state of the battery pack 1, etc. is outputted to the control section 23 via the insulated section 24.

The control section 23 is constituted by a microcomputer constituted by a CPU, a ROM, a RAM, an EEPROM, etc., and peripheral devices, and it is constituted so that various processes such as control processing of each monitoring circuit 22 and judgment processing of abnormalities in voltage of the battery pack 1 according to a control program are memorized in a memory means, such as the ROM.

The insulated section 24 is a signal transfer means to transmit a signal bi-directionally where between each monitoring circuit 22 and the control sections 23 is insulated, and is constituted by a photo-coupler etc., for example.

Figure 2:
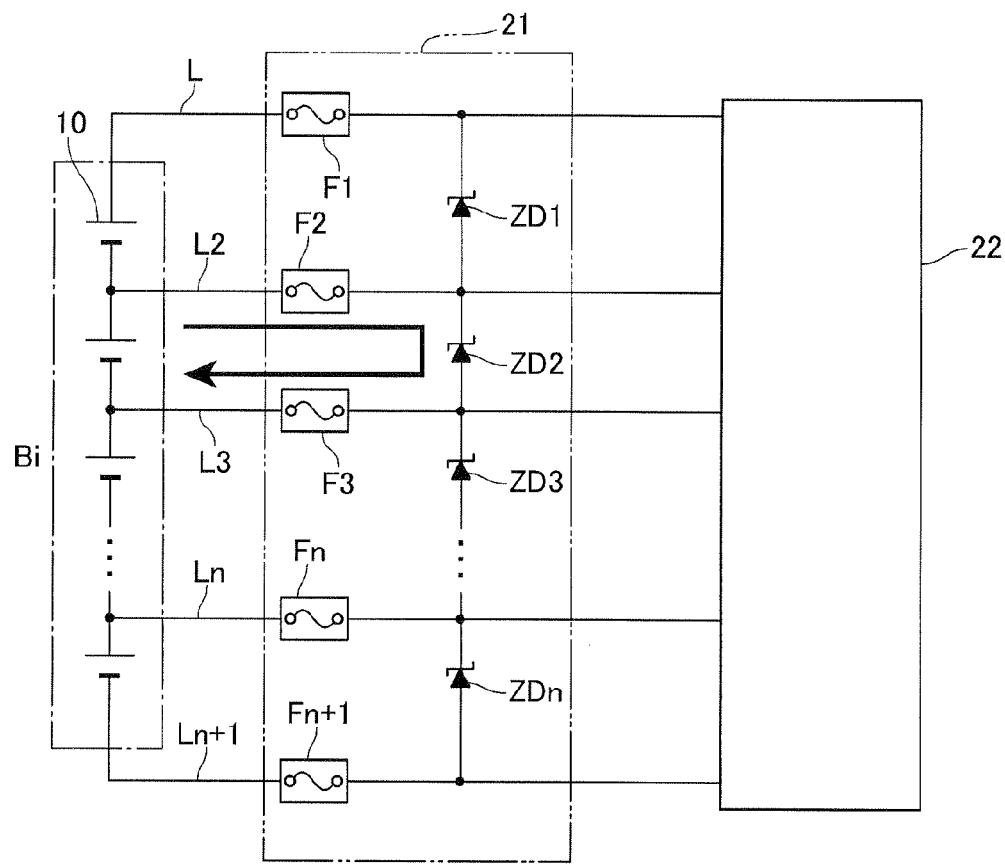
FIG. 2 shows a block diagram of a principal part of a battery monitor in the first embodiment.

Next, details of the circuit protecting section 21 of the present embodiment are explained using FIG. 2.

In addition, one battery block Bi among the plurality of battery blocks B1 . . . Bn, the monitoring circuit 22 that monitors the battery block Bi, and the circuit protecting section 21 that protects the monitoring circuit 22 are shown in FIG. 2 for convenience of explanation.

The overvoltage protection element 212 of the present embodiment is an element that prevents an excess voltage occurring in the battery block Bi from being applied to the monitoring circuit 22.

Moreover, the overvoltage protection element 212 is constituted so that between the detection lines L connected to both the terminals of the battery cell 10 is maintained in a short circuit state (conduction state) when the excess voltage occurs in a part of the battery cell 10 that constitutes the battery block Bi.

The overvoltage protection element 212 is constituted by a Zener diode ZD, and as shown in FIG. 2, the Zener diodes ZD1 . . . ZDn are connected between each detection line L1 . . . Ln+1 in the present embodiment.

A breakdown voltage (for example, several times of a full charge voltage of the battery cell 10) is configured in the Zener diode ZD of the present embodiment considering the voltage of the battery cell 10 and a required robustness of the monitoring circuit 22.

In addition, in each Zener diode ZD1 . . . ZDn, among a pair of detection lines L connected to both the terminals of the battery cell 10, a cathode is connected to a detection line connected to the high potential side terminal of the battery cell 10, and an anode is connected to a detection line connected to the low potential side terminal.

Moreover, the Zener diode ZD with a structure that short-circuit-faults when the excess voltage is applied is adopted in the present embodiment.

Figure 3:
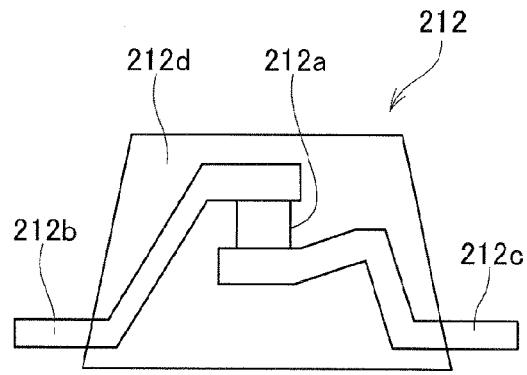
FIG. 3 shows a schematic diagram of a Zener diode in the first embodiment.

Specifically, as shown in the schematic diagram of FIG. 3, the Zener diode ZD of the present embodiment is constituted by a PN junction type IC chip 212a, a pair of lead frames 212b and 212c that sandwich the IC chip 212a in one end sides, and an exterior part 212d made of resin that covers the IC chip 212a, and parts of the lead frames 212b and 212c.

In addition, if the Zener diode ZD has a structure that the IC chip 212a and the lead frames 212b and 212c are bonded of with a wire, the wire may fracture and open-circuit-faults when the excess voltage is applied.

For this reason, the Zener diode ZD having the structure that sandwiches the IC chip 212a directly by the pair of lead frames 212b and 212c is adopted in the present embodiment.

Next, the circuit protection element 211 of the present embodiment is constituted so that the electrical link between both the terminals of the battery cell 10 and the monitoring circuit 22 where the over-current is generated may be intercepted by the short-circuit current that flows between the detection lines L through the overvoltage protection element 212 when the excess voltage is being generated.

That is, the circuit protection element 211 uses an element that is broken due to the short-circuit current that flows between the detection lines L through the overvoltage protection element 212 when the excess voltage is being generated.

Specifically, the overvoltage protection element 212 is constituted by a fuse F that blows when a current more than rated current flows through the circuit protection element 211, and as shown in FIG. 2, the fuse F1 ... Fn+1 is disposed in each detection line L1 ... Ln+1 in the present embodiment.

The fuse F of the present embodiment is constituted so that it is blown due to the high current that flows into the detection line L when the Zener diode ZD short-circuit-faults due to the excess voltage.

That is, the rated current of the fuse F is configured based on the high current that flows into the detection line L when the Zener diode ZD short-circuit-faults due to the excess voltage.

In addition, since it has influence on an accuracy of the voltage monitoring in the monitoring circuit 22, etc. when the resistance component in the fuse F is large, it is desirable to select the fuse F with a small resistance value.

Next, function of the circuit protecting section 21 when the excess voltage occurs on the battery pack 1 is explained.

When the excess voltage occurs in the battery pack 1 and the voltage that exceeds the breakdown voltage is applied to the Zener diode ZD1 ... ZDn, high current (short-circuit current) flows into the closed circuit formed between the battery pack 1 and the Zener diode ZD1 ... ZDn.

If the Zener diode ZD1 ... ZDn short-circuit-faults, high current (short-circuit current) continues flowing into the closed circuit formed between the battery pack 1 and Zener diode ZD1 ... ZDn.

Then the fuse F1 ... Fn+1 fractures by the high current and the electrical link between the battery pack 1 and the monitoring circuit 22 is intercepted.

Accordingly, since the excess voltage is not applied to the monitoring circuit 22 side, the monitoring circuit 22 is appropriately protected from the excess voltage occurring in the battery pack 1.

For example, if the excess voltage occurs in the battery cell 10 that serves as the second high potential of the battery block Bi shown in FIG. 2, and the voltage that exceeds the breakdown voltage is applied to the Zener diode ZD2, a high current (short-circuit current) flows into the battery cell 10, the detection lines L2 and L3, and the closed circuit formed by the Zener diode ZD2 (refer to an arrow in FIG. 2).

If the Zener diode ZD1 ... ZDn short-circuit-faults at this time, because the high current (short-circuit current) continues flowing into the closed circuit formed between the battery cell 101 and the Zener diode ZD2, the fuse F2 fractures and the electrical link between the battery cell 10 and the monitoring circuit 22 is intercepted.

The circuit protecting section 21 of the present embodiment explained above is constituted by the overvoltage protection element 212 that maintains between each detection line L in the short circuit state when the excess voltage occurs in the battery pack 1, and the circuit protection element 211 that fractures according to the high current that flows between each detection line L via the overvoltage protection element 212 when the excess voltage occurs in the battery pack 1.

Thereby, between each detection line L is maintained in the short circuit state by the overvoltage protection element 212 when the excess voltage occurs in the battery pack 1, and since the electrical link between the battery pack 1 and the monitoring circuit 22 is intercepted by the circuit protection element 211, the monitoring circuit 22 can be appropriately protected from the excess voltage occurring in the battery pack 1.

As a result, it is not necessary to constitute the monitoring circuit 22 from a robust high voltage element, or to add a protection element in the monitoring circuit 22 in order to prevent failure of the monitoring circuit 22 by the excess voltage that occurs in the battery pack 1, and can suppress a complication of the circuit configuration accompanying a suitable protection of the monitoring circuit 22 and cost escalation.

In addition, since the circuit protection element 211 can configure the breaking current (rated current) on the basis of the short-circuit current that flows between each detection line L when the excess voltage occurs in the battery pack 1, it becomes easy to select the circuit protection element 211.

Furthermore, the overvoltage protection element 212 is constituted by the Zener diode ZD that short-circuit-faults when the excess voltage is applied in the present embodiment.

For this reason, since any circuit protection element that intercepts each detection line L by the short-circuit current that flows between each detection line L when the Zener diode ZD short-circuit-faults can be used, the choice of the circuit protection element 211 increases and selection of the circuit protection element 211 becomes easy.

Second Embodiment

Next, the second embodiment is explained.

It should be appreciated that, in the second embodiment components identical with or similar to those in the first embodiment are given the same reference numerals for the sake of omitting or simplifying explanation.

Figure 4:
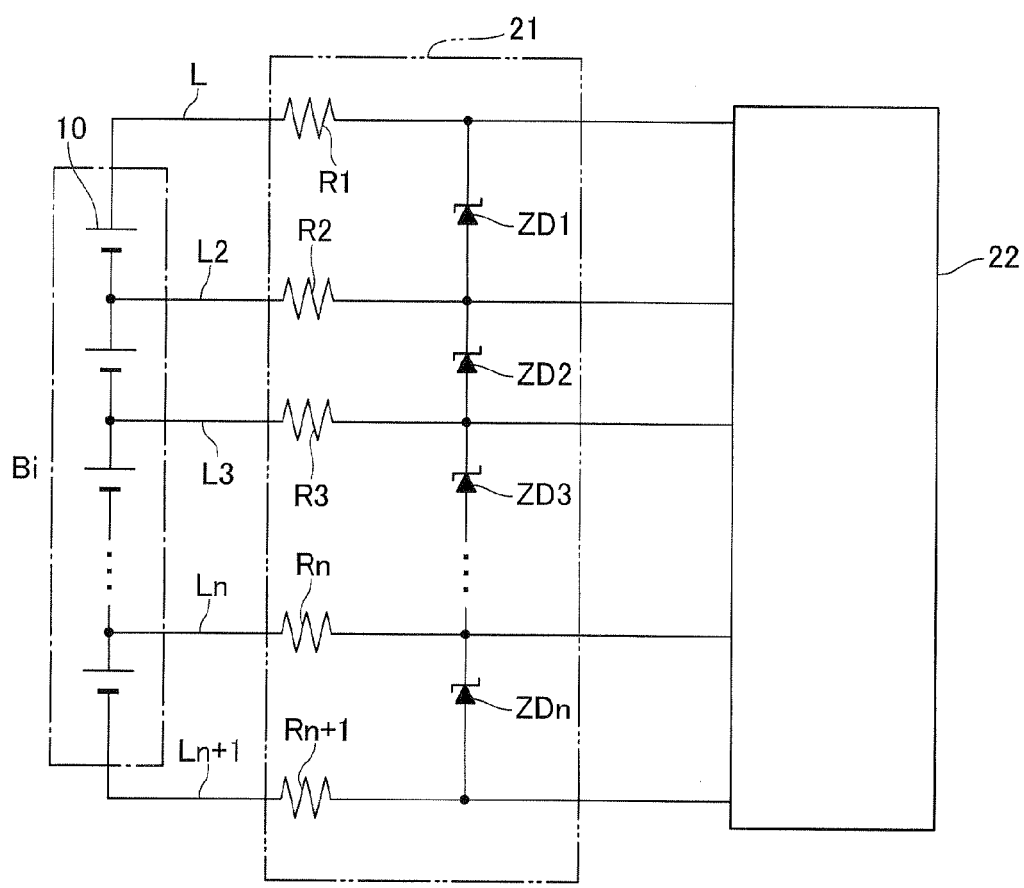
FIG. 4 shows a block diagram of a principal part of a battery monitor in a second embodiment.

As shown in the block diagram of FIG. 4, the present embodiment constitutes the circuit protection element 211 from a low resistance resistor R instead of the fuse F.

The low resistance resistor R of the present embodiment uses a resistive element that disconnects like the fuse F due to the short-circuit current that flows between the detection lines L via the overvoltage protection element 212 when the excess voltage is occurring.

In addition, in order to suppress the influence on the voltage detection performance in the monitoring circuit 22, a low resistance resistor R is desirable to be constituted to have low resistance.

Even if the circuit protection element 211 is constituted by the low resistance resistor R like the present embodiment, the same function and effect as the first embodiment can be accomplished.

Furthermore, if the circuit protection element 211 is constituted the low resistance resistor R that has a lower unit price than the fuse F, it becomes possible to reduce the cost of the circuit protecting section 21.

Other Embodiments

Although the embodiments of the present disclosure are explained above, the present disclosure is not limited to this, and unless it deviates from the range indicated to each claim, it can be modified suitably. For example, it can change variously as follows.

Although each embodiment mentioned above explains the examples that constitute the circuit protection element 211 using the fuse F and the low resistance resistor R, it is not limited only to the low resistance resistor R and the fuse F, but any element that can perform a function equivalent to the fuse F may be employable as the circuit protection element 211.

Although each embodiment mentioned above explains the examples that constitute the overvoltage protection element 212 using the Zener diode ZD, it is not limited only to the Zener diode ZD, but any element that can perform a function equivalent to the Zener diode ZD may be employable as the overvoltage protection element 212.

Although each embodiment mentioned above explains the examples that the circuit protector of the present disclosure is applied to the monitoring circuit 22 that monitors the voltage of the battery pack 1 installed in the vehicles, it may be applied to the monitoring circuit that monitors a voltage of a power supply unit for other uses.

In addition, the power supply unit is not limited to a battery but any power supply that can supply electric power to various current consumers.

What is claimed is:

1. A circuit protector for protecting a monitoring circuit that monitors a voltage of a power supply unit comprising:
   a plurality of detection lines for voltage detection that connect between the power supply unit and the monitoring circuit;
   an overvoltage protection element connected between the detection lines that keeps the voltage applied to the monitoring circuit at a fixed voltage; and
   a circuit protection element disposed in each detection line that disconnects an electrical link between the monitoring circuit and the power supply unit when a current beyond a predetermined current value flows into the detection line; wherein:
   the overvoltage protection element is constituted so that conduction between each detection line is maintained in a short circuit state when an excess voltage occurs in the power supply unit;
   the circuit protection element is constituted so that the electrical link between the power supply unit and the monitoring circuit is intercepted by a short-circuit current that flows between the detection lines via the overvoltage protection element when the excess voltage occurs in the power supply unit;
   the overvoltage protection element connected between the detection lines short-circuit-faults when the excess voltage is applied thereto;
   the overvoltage protection element is configured so that between each detection line is maintained in a short circuit state by a short-circuit-fault when the excess voltage occurs in the power supply unit;
   the circuit protection element is provided with an IC chip and a lead frame; and
   the lead frame is directly connected to both an anode and a cathode of the IC chip.

2. The circuit protector for protecting according to claim 1, wherein,
   the overvoltage protection element is constituted by a Zener diode that short-circuit-faults when the excess voltage is applied thereto.

3. The circuit protector for protecting according to claim 1, wherein,
   the circuit protection element is constituted by a fuse that is blown due to the short-circuit current that flows between the detection lines via the overvoltage protection element when the excess voltage occurs in the power supply unit.

4. The circuit protector for protecting according to claim 1, wherein,
   the circuit protection element is constituted by a low resistance resistor that is blown due to the short-circuit current that flows between the detection lines via the overvoltage protection element when the excess voltage occurs in the power supply unit.

5. The circuit protector for protecting according to claim 2, wherein,
   the circuit protection element is constituted by a fuse that is blown due to the short-circuit current that flows between the detection lines via the overvoltage protection element when the excess voltage occurs in the power supply unit.

6. The circuit protector for protecting according to claim 2, wherein,
   the circuit protection element is constituted by a low resistance resistor that is blown due to the short-circuit current that flows between the detection lines via the overvoltage protection element when the excess voltage occurs in the power supply unit.

* * * * *